United States Patent
Ko

(10) Patent No.: US 7,190,228 B2
(45) Date of Patent: Mar. 13, 2007

(54) GAIN CONTROL DEVICE OF TRANSMITTER IN MOBILE COMMUNICATION TERMINAL AND METHOD THEREOF

(75) Inventor: Jae-Seung Ko, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 118 days.

(21) Appl. No.: 11/122,186

(22) Filed: May 4, 2005

(65) Prior Publication Data

US 2006/0071713 A1  Apr. 6, 2006

(30) Foreign Application Priority Data

Oct. 6, 2004  (KR) .................... 10-2004-0079311

(51) Int. Cl.
*H03G 3/10* (2006.01)
(52) U.S. Cl. ...................................... 330/289; 330/285
(58) Field of Classification Search ................ 330/289, 330/285, 134
See application file for complete search history.

(56) References Cited

U.S. PATENT DOCUMENTS 6,677,823 B2 * 1/2004 Terosky et al. ............. 330/289
2005/0200406 A1 * 9/2005 Dauphinee et al. ......... 330/129

* cited by examiner

*Primary Examiner*—Robert Pascal
*Assistant Examiner*—Hieu Nguyen
(74) *Attorney, Agent, or Firm*—The Farrell Law Firm

(57) ABSTRACT

A gain control device of a transmitter in a mobile communication terminal is provided. The device includes a temperature sensor for sensing an external temperature, a power amplifying module for amplifying a radio frequency output, a gain control circuit for controlling a voltage gain of the power amplifying module, a fixed gain circuit for providing a fixed voltage gain to the power amplifying module, a switch for switching to connect the power amplifying module to one of the gain control circuit and the fixed gain circuit, and a controller for generating a control signal to control the switch depending on the sensed external temperature.

15 Claims, 3 Drawing Sheets

Prior Art

Prior Art

GAIN CONTROL DEVICE OF TRANSMITTER IN MOBILE COMMUNICATION TERMINAL AND METHOD THEREOF

PRIORITY

This application claims priority under 35 U.S.C. § 119 to an application entitled "Gain Control Circuit Of Transmitter In Mobile Terminal And Method Thereof" filed in the Korean Intellectual Property Office on Oct. 6, 2004 and assigned Ser. No. 2004-0079311, the contents of which are hereby incorporated by reference.

BACKGROUND OF THE INVENTION

1. Field of the Invention

The present invention relates to a Code Division Multiple Access (CDMA) mobile communication terminal, and more particularly, to a device and method of controlling the gain of a Power Amplifying Module (PAM) in a Radio Frequency (RF) transmitter of a mobile communication terminal.

2. Background of the Prior Art

As greater amounts of data are being transmitted as a result of the advances in the technology of network design, and the number of users is greatly increasing in a Code Division Multiple Access (CDMA) mobile communication system, an average transmission power per call is being gradually reduced. Accordingly, an effort is being made to reduce the quiescent power requirements of a transmitter, the power consumption during inactive or non-calling mode, thereby increasing a calling time by reducing battery consumption.

However, due to the chipsetting of parts, only a Power Amplifying Module (PAM) can have its quiescent current reduced. The PAM disposed at an end terminal of a CDMA transmitter mainly uses a gallium arsenide Microwave Monolithic Integrated Circuit (MMIC) to perform its functions. The PAM uses large amounts of quiescent current, and also has a great current saving effect.

An Adjacent Channel Power Ratio (ACPR) of the PAM has a good characteristic at a high gain. The quiescent current of the PAM has less idle current consumed at a low gain.

The gain determined by an input/output value calculation is controlled to obtain appropriate values of the characteristics of the PAM. At power levels ranging from 0 dBm to a maximum power level, the ACPR is more important than the quiescent current, and at power levels below 0 dBm, the quiescent current is important.

Accordingly, depending on a Pulse Density Modulation (PDM) signal of an additional circuit or a modem, the PAM is operated with the high gain at a high output power, and is operated with the low gain at a low output power, or the PAM can be used with an optimal gain fixed.

In other words, the gain of the PAM is controlled where gain is either fixed to provide a good temperature characteristic, or where the gain is reduced at the low output power to reduce the quiescent current.

FIG. 1 illustrates a conventional Power Amplifying Module (PAM) variable gain device.

In FIG. 1, a Power Amplifying Module (PAM) 100 amplifies an output power of an RF transmitter to transmit the amplified power to an antenna terminal. "Pin" denotes an input power input to the PAM 100, and "Pout" denotes an output power amplified through the PAM 100. Accordingly, the output power (Pout) is determined by the input power (Pin) and a gain.

In FIG. 1, the PAM 100 variable gain device has a variable gain. Accordingly, a constant gain is provided to generate a necessary output. A gain control circuit 102 amplifies the input power (Pin) to generate the output power (Pout) according to a predetermined gain.

The PAM 100 is driven by a control signal of an Automatic Gain Controller (AGC) 104 and a $V_{control}$ output from the gain control circuit 102. A modem 106 drives the AGC 104 and the gain control circuit 102 using a Pulse Density Modulation (PDM) signal, which is a control signal for driving the AGC 104 and the gain control circuit 102.

As described above, in case where an electric field is changed, for example, in case where the electric field is weakened as the communication terminal is moving away from a base station, the PAM 100 requires a high output. At this time, the gain control circuit 102 increases a gain, thereby providing the high output.

FIG. 2 illustrates a conventional PAM fixed gain device.

In FIG. 2, a Power Amplifying Module (PAM) 100 amplifies an output power of a RF transmitter to transmit the amplified power to an antenna terminal. "Pin" denotes an input power input to the PAM 100, and "Pout" denotes an output power amplified through the PAM 100. Accordingly, the output power (Pout) is determined by the input power (Pin) and a gain.

In FIG. 2, the PAM 100 fixed gain device has a preset fixed gain. Accordingly, a necessary output is generated depending on the fixed gain. That is, a fixed gain circuit 103 amplifies the input power (Pin) to generate the output power (Pout) according to a predetermined fixed gain.

The PAM 100 is driven by a control signal of an Automatic Gain Controller (AGC) 104 and a $V_{control}$ output from the fixed gain circuit 103. A modem 106 drives the AGC 104 using a Pulse Density Modulation (PDM) signal, which is a control signal for driving the AGC 104.

In case where an electric field is weakened as the communication terminal moves away from a base station, the PAM 100 requires a high output. At this time, since the gain is preset, the fixed gain circuit 103 requires a high input power (Pin) to provide the high output. This also causes a high quiescent current.

Meanwhile, the conventional PAM variable gain device providing the variable gain generates a gain deviation of the PAM when it is operated with the low gain.

Especially, the conventional PAM variable gain device creates a high gain deviation to the PAM in the external environment of a temperature of −30 to 60° C., and generates even greater gain deviation at a low power of approximately −50 dBm. Further, if the gain of the PAM is fixed without control, the conventional PAM variable gain device has a constant characteristic in the external environment of the temperature of −30 to 60° C., but has a drawback in that the quiescent current is relatively increased.

SUMMARY OF THE INVENTION

The present invention provides a gain control device of a transmitter in a mobile communication terminal and a method thereof in which a quiescent current is reduced at a room temperature to increase a calling time, and a constant characteristic of the transmitter is secured in an external temperature environment.

According to an aspect of the present invention, there is provided a gain control device of a transmitter in a mobile communication terminal, the device including a temperature sensor for sensing an external temperature; a power amplifying module for amplifying a radio frequency output; a gain control circuit for controlling a voltage gain of the power amplifying module; a fixed gain circuit for providing the voltage gain of the power amplifying module; a switch for switching to connect the power amplifying module to one of the gain control circuit and the fixed gain circuit; and a controller for generating a control signal to control the switch depending on the sensed external temperature.

According to another aspect of the present invention, there is provided a gain controlling method in a transmitter of a mobile communication terminal, the method including the steps of sensing an external temperature in a temperature sensor; generating a switch control signal according to the sensed external temperature; and connecting a power amplifying module to one of a gain control circuit and a fixed gain circuit depending on the switch control signal.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Also, when it is determined that the subject matter of the invention may be obscured by a detailed description, the detailed description will be omitted.

Figure 1:
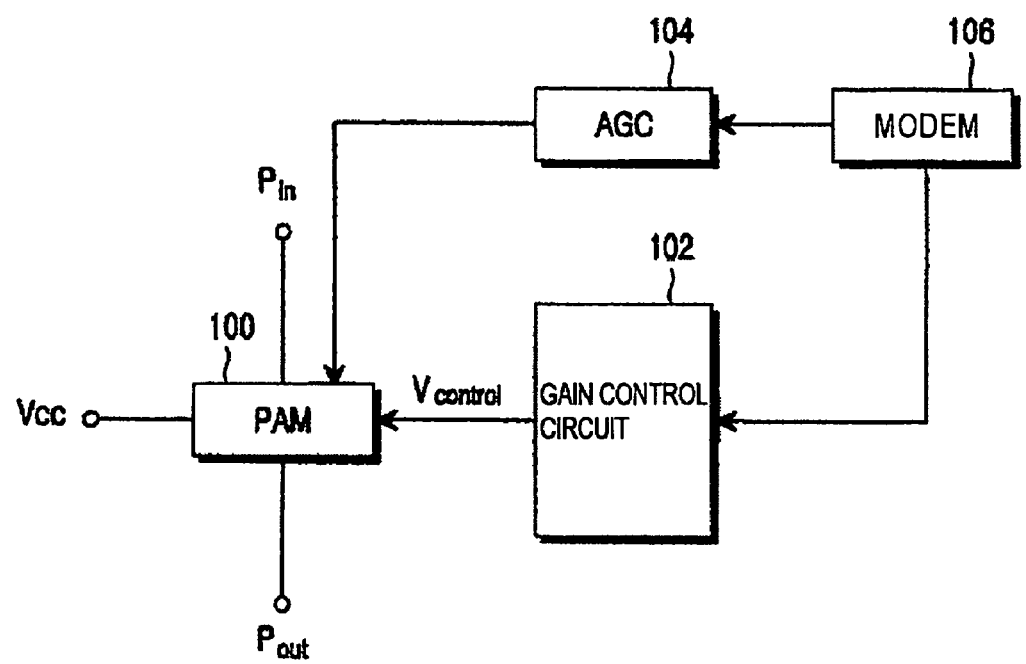
FIG. 1 illustrates a conventional Power Amplifying Module (PAM) variable gain device.
Figure 2:
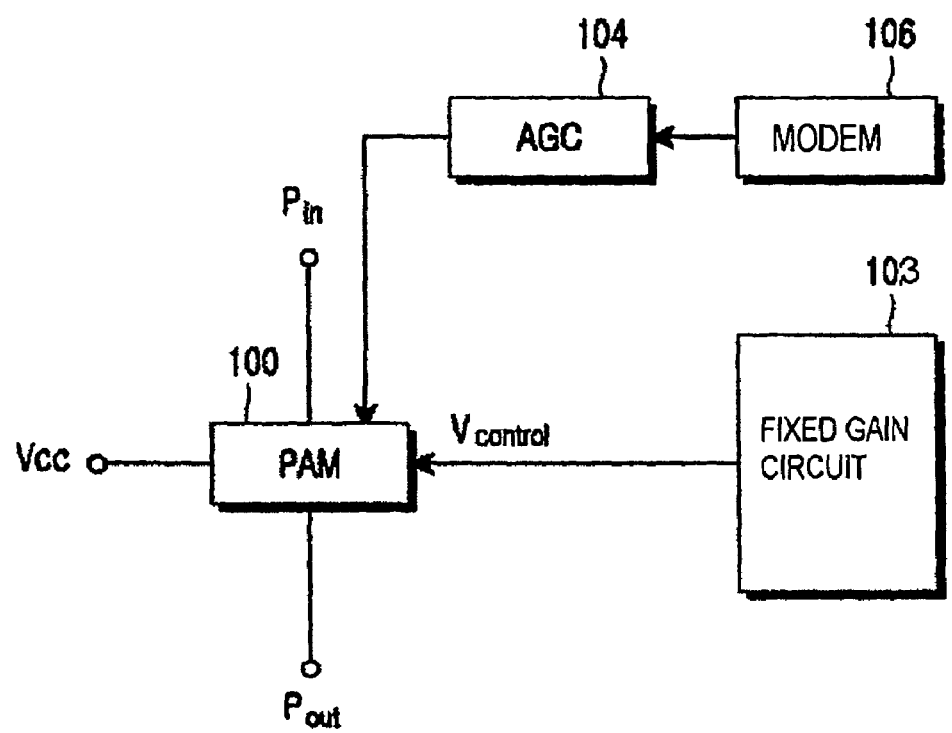
FIG. 2 illustrates a conventional PAM fixed gain device.
Figure 3:
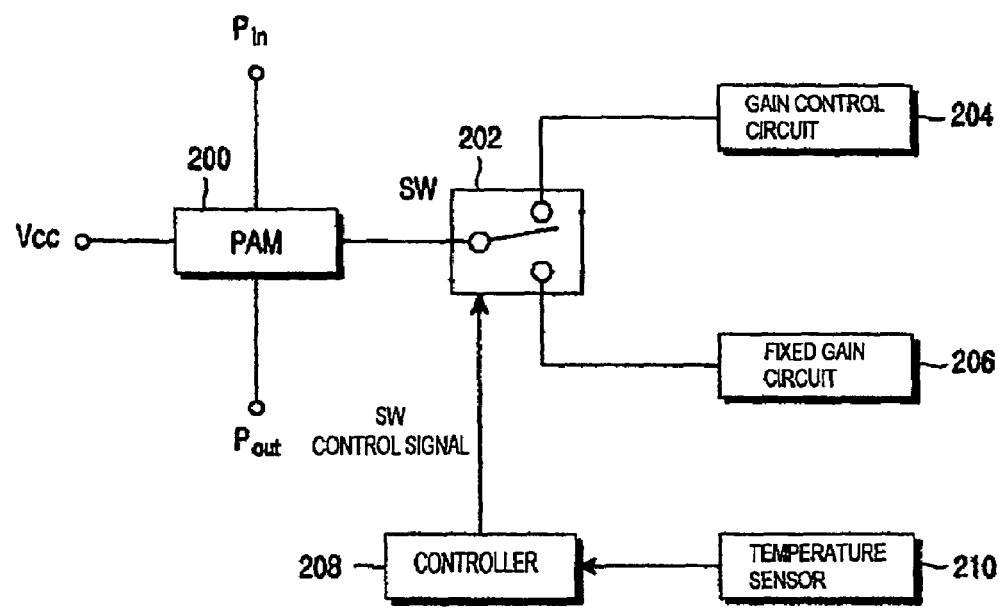
FIG. 3 illustrates a PAM gain control device according to the present invention.

FIG. 3 illustrates a Power Amplifying Module (PAM) gain control device according to the present invention.

The present invention is characterized in that a particular gain providing circuit can be selected depending on an external temperature environment. That is, according to the present invention, a voltage gain is provided using a fixed gain circuit 206 in the external temperature environment in which a gain deviation of a PAM is increased, and a voltage gain is provided using a gain control circuit 204 at a room temperature.

In FIG. 3, a Power Amplifying Module (PAM) 200 amplifies an output power of a RF transmitter to transmit the amplified power to an antenna terminal. "Pin" denotes an input power input to the PAM 200, and "Pout" denotes an output power amplified through the PAM 200. Accordingly, the output power (Pout) is determined by the input power (Pin) and a gain.

The PAM 200 gain control device of FIG. 3 includes a gain control circuit 204 for providing a variable gain and a fixed gain circuit 206 for providing a fixed gain.

One of the gain control circuit 204 and the fixed gain circuit 206 is selected to generate a necessary output. According to the gain provided by the selected circuit, the PAM 200 generates the output power (Pout) to transmit the generated output power to the antenna terminal.

As described above, the mobile communication terminal according to the present invention includes a temperature sensor 210 to sense a temperature of the external environment and determine whether or not the external environment is at a room temperature. If it is determined that the external environment is at the room temperature at which the quiescent current should be considered to be of importance, a controller 208 controls a switch 202 to switch to the gain control circuit 204 that can control a gain of the PAM 200. At this time, a gain control circuit 204 mode is performed to minimize the quiescent current.

The controller 208 generates a switch control signal to select any one of the gain control circuit 204 and the fixed gain circuit 206. The temperature sensor 210 can be generally installed within a modem chip of the mobile communication terminal. Considering that the mobile communication terminal is mainly used at the room temperature, it is presumed that the present invention generally operates in the gain control circuit 204 mode.

In the gain control circuit 204 mode, the PAM 200 gain control device provides the variable gain so that a constant gain is provided to generate a necessary output. The gain control circuit 204 amplifies the input power (Pin) to the output power (Pout) depending on the determined gain. Generally, the controller 208 installed within the modem drives the gain control circuit 204 to provide the necessary gain of the PAM 200.

In case where an electric field is changed, for example, where the electric field is weakened as the communication terminal moves away from a base station, the PAM 200 requires a high output. At this time, the gain control circuit 204 increases a gain, thereby providing the high output.

In case where the gain control circuit 204 controls the gain to provide a desired output, especially in the case where the low gain is provided, it is general required to deviate from a desired gain.

For example, in case where the gain control circuit 204 providing a normal gain of 10 controls the gain to provide a gain of 5 or 2, a real gain of 4.8 or 5.2 is set even at the room temperature, to cause the deviation from the desired gain.

In case where the external temperature environment is not at room temperature, the gain deviation is increased. For example, at a temperature of less than 0° C. or above 40° C., the gain control circuit 204 has a high level of difficulty providing the desired gain. This results in a difficulty in providing an appropriate output, to the detriment of the reliability of the mobile communication terminal.

At this time, the mobile communication terminal determines the temperature of the external environment to determine whether or not the external environment is not at the room temperature. If it is determined that the external environment is not at room temperature, that is, is at a high temperature or a low temperature, the controller 208 controls the switch 202 to switch to the fixed gain circuit 206 for fixing the gain of the PAM 200.

In the external environment outside of room temperature, the constant characteristic of the transmitter is of importance. The fixed gain circuit 206 operates to allow the PAM 200 to have the constant characteristic.

The fixed gain circuit 206 is preset to an optimal gain. According to the gain, the PAM 200 generates the output power (Pout) to transmit the generated output power (Pout) to the antenna terminal.

In case where it is difficult to provide the desired gain due to the external temperature being outside of the room temperature as described above, the controller 208 is operated in the fixed gain circuit 206 mode converted from the gain control circuit 204 mode, to secure the appropriate output.

In other words, the PAM gain control device according to the present invention uses the gain control circuit 204 mode at room temperature (0 to 40° C.) to reduce the quiescent current, and converts into and uses the fixed gain circuit 206 mode in the external environment of the low temperature (−30 to 0° C.) and the high temperature (40 to 60° C.) to fix an appropriate gain.

As a result, when low power is transmitted at the room temperature, the controller 208 selects the gain control circuit 204 to control the gain, thereby reducing the quiescent current and increasing the calling time.

The mobile communication terminal is mainly used at the room temperature. Accordingly, the gain control circuit 204 mode is generally used to minimize the quiescent current.

Further, at the low temperature (for example, −30 to −10° C.) and the high temperature (for example, 50 to 60° C.), which are conditions for satisfying a temperature environment standard of the mobile communication terminal, the fixed gain circuit 206 is selected to fix the gain, thereby providing the constant characteristic of the transmitter. As the gain of the PAM 200 is fixed, the constant characteristic of the transmitter can be secured even in an environment outside of room temperature.

As described above, when the mobile communication terminal is used, the quiescent current is reduced at the room temperature to increase the calling time, and the constant characteristic of the transmitter can be secured based on the external temperature environment.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A gain control device of a transmitter in a mobile communication terminal, comprising:
    a temperature sensor for sensing an external temperature;
    a power amplifying module for amplifying a radio frequency output;
    a gain control circuit for providing a variably controlled voltage gain to the power amplifying module;
    a fixed gain circuit for providing a fixed voltage gain to the power amplifying module;
    a switch for switching to connect the power amplifying module to one of the gain control circuit and the fixed gain circuit; and
    a controller for generating a control signal to control the switch depending on the sensed external temperature by the temperature sensor.

2. The device of claim 1, wherein the power amplifying module provides the voltage gain determined by one of the gain control circuit and the fixed gain circuit.

3. The device of claim 1, wherein the gain control circuit provides the voltage gain for minimizing a quiescent current.

4. The device of claim 1, wherein when the external temperature is less than 0° C., the controller generates a switch control signal for selecting the fixed gain circuit.

5. The device of claim 1, wherein when the external temperature is greater than 40° C., the controller generates the switch control signal for selecting the fixed gain circuit.

6. A mobile communication terminal having a gain control device, the gain control device comprising:
    a temperature sensor for sensing an external temperature;
    a power amplifying module for amplifying a radio frequency output;
    a gain control circuit for providing a variably controlled voltage gain to the power amplifying module;
    a fixed gain circuit for providing a fixed voltage gain to the power amplifying module;
    a switch for switching to connect the power amplifying module to one of the gain control circuit and the fixed gain circuit; and
    a controller for generating a control signal to control the switch depending on the sensed external temperature by the temperature sensor.

7. The terminal of claim 6, wherein the power amplifying module provides the voltage gain determined by one of the gain control circuit and the fixed gain circuit.

8. The terminal of claim 6, wherein the gain control circuit provides the voltage gain for minimizing a quiescent current of the mobile communication terminal.

9. The terminal of claim 6, wherein when the external temperature is less than 0° C., the controller generates a switch control signal for selecting the fixed gain circuit.

10. The terminal of claim 6, wherein when the external temperature is greater than 40° C., the controller generates the switch control signal for selecting the fixed gain circuit.

11. A gain controlling method, comprising the steps of:
    sensing an external temperature;
    generating a switch control signal according to the sensed external temperature; and
    connecting a power amplifying module to one of a gain control circuit and a fixed gain circuit depending on the switch control signal.

12. The terminal of claim 11, wherein the power amplifying module provides the voltage gain determined by one of the gain control circuit and the fixed gain circuit.

13. The terminal of claim 11, wherein the gain control circuit provides the voltage gain for minimizing a quiescent current.

14. The terminal of claim 11, wherein when the external environment is less than 0° C., the controller generates a switch control signal for selecting the fixed gain circuit.

15. The terminal of claim 11, wherein when the external environment is greater than 40° C., the controller generates the switch control signal for selecting the fixed gain circuit.

* * * * *